United States Patent [19]

Atwell, Jr. et al.

[11] Patent Number: 5,001,731
[45] Date of Patent: Mar. 19, 1991

[54] METHOD AND APPARATUS FOR ELIMINATING CLOCKSKEW RACE CONDITION ERRORS

[75] Inventors: William D. Atwell, Jr.; Richard B. Reis, both of Austin, Tex.

[73] Assignee: Motorola, Inc., Schaumburg, Ill.

[21] Appl. No.: 415,671

[22] Filed: Oct. 2, 1989

[51] Int. Cl.$^5$ .............................................. H03K 17/28
[52] U.S. Cl. ...................................... 375/107; 371/1; 307/480
[58] Field of Search ............... 307/480, 481, 252, 279, 307/272.1, 601; 328/72, 73, 55, 58; 375/106, 107, 118; 371/1

[56] References Cited

U.S. PATENT DOCUMENTS

| | | | |
|---|---|---|---|
| 4,398,155 | 8/1983 | Atwell, Jr. et al. ................. | 375/107 |
| 4,426,713 | 1/1984 | Shimizu et al. ..................... | 375/106 |
| 4,737,971 | 4/1988 | Lanzafame et al. ................. | 371/1 |
| 4,811,364 | 3/1989 | Sager et al. ........................ | 375/106 |
| 4,881,165 | 11/1989 | Sager et al. ........................ | 375/106 |
| 4,949,249 | 8/1990 | Lefsky et al. ....................... | 371/1 |

*Primary Examiner*—Benedict V. Safourek
*Attorney, Agent, or Firm*—Robert L. King

[57] ABSTRACT

A method and apparatus in an integrated circuit having a plurality of distinct circuit modules which eliminates undesired effects of clock skewing when a common system clock is used. The same phase of the same system clock is used by both a transmitting circuit module and a receiving circuit module when data is communicated between two circuit modules. The receiving circuit module has an input portion having a first transistor clocked by the same phase of the same system clock, a latch and a second transistor. The latch and second transistor are clocked by a complement of the same phase of the system clock.

5 Claims, 3 Drawing Sheets

METHOD AND APPARATUS FOR ELIMINATING CLOCKSKEW RACE CONDITION ERRORS

TECHNICAL FIELD

This invention relates to clocked circuits, and more particularly, to clocked circuits which utilize synchronous clocks.

BACKGROUND OF THE INVENTION

In integrated circuits, centralized clock signals are frequently used to provide timing and control signals to various distinct modules of an entire system embodied by the integrated circuit. One result of a centralized clock signal is a synchronous clock structure. As transistor count and operating frequency increase, on-chip resistor/capacitor (RC) delays inherent in all circuits create clock skews which severely degrade the synchronous nature of the circuit. To address this problem, others have increased the clock signal's drive current and run multiple or very wide clock conductors across the integrated circuit's topography. This known approach however does not adequately solve the clock skew problem on large core-based circuit designs. The previous techniques have created large power consumption and reference ground variation resulting in tri-state voltage leakage at outputs. More importantly, race conditions can be created when complementary clock signals become unsymmetrical or skewed. When clock skews exist, clocked logic circuitry may transmit or latch data during an incorrect clock phase. The latching of data during an unintended clock cycle quickly results in a system failure. In a previous approach to this problem, others have tailored custom specific circuit paths and sized transistor control electrode dimensions to control race conditions. This approach however is application specific and is not universally applicable.

SUMMARY OF THE INVENTION

Accordingly, it is an object of the present invention to provide an improved circuit and method for eliminating clockskew race conditions.

Another object of the present invention is to provide an improved method and apparatus for providing an improved integrated circuit which minimizes operating failures due to clock skews.

In carrying out the above and other objects of the present invention, there is provided, in one form, a method and apparatus for eliminating race conditions in a data processing system resulting from skewing of a system clock. The data processing system uses a single system clock for timing and control functions in each of a plurality of circuit portions of the system. Data is transmitted from a first of the circuit portions to a second of the circuit portions in response to the system clock during a predetermined phase of the system clock. Data is selectively received and latched by the second circuit portion in response to the same phase of the system clock which transmits the data from the first circuit portion. The system clock which is used by the second circuit portion may have a logic level transition which is skewed from the system clock which transmits the data. However, by using the same phase of the single system clock in all of the circuit portions, race condition errors are eliminated in the system, thereby eliminating system timing errors.

These and other objects, features, and advantages, will be more clearly understood from the following detailed description taken in conjunction with the accompanying drawings.

DETAILED DESCRIPTION OF THE INVENTION

Figure 1:
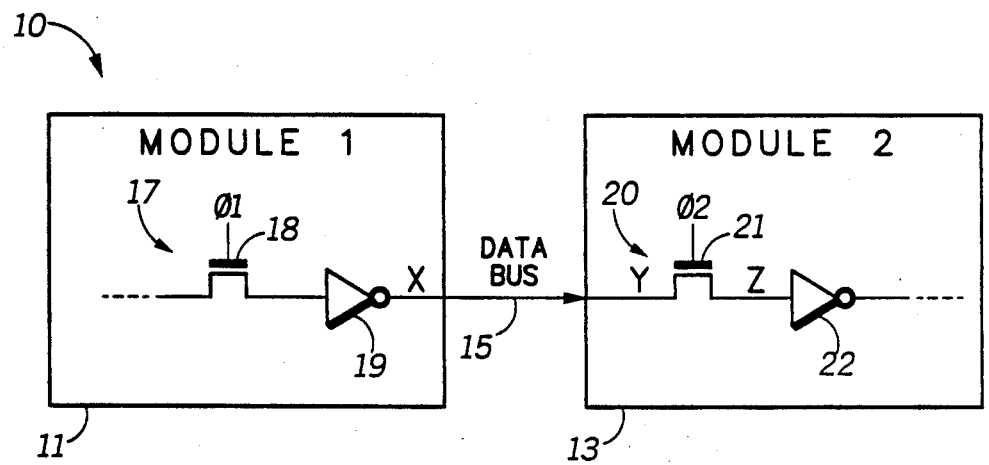
FIG. 1 illustrates in partial schematic form a known coupling of two circuit modules in a circuit via a data bus.

Shown in FIG. 1 is a partial schematic of a known integrated circuit 10 having a first module 11 coupled to a second module 13 via a data bus 15. Only an output drive portion 17 of the first module 11 is shown in FIG. 1 having a transistor 18 having a first current electrode for receiving a data signal, a control electrode coupled to a clock signal labeled "$\phi 1$" and a second current electrode. An input of an inverter 19 is connected to the second current electrode of transistor 18, and an output of inverter 19 is connected to data bus 15. Inverter 19 provides an output signal labeled "X". The second module 13 has an input portion 20 which is connected to data bus 15. Input portion 20 has a transistor having a first current electrode connected to data bus 15 and receiving a signal labeled "Y", a control electrode for receiving a clock signal labeled "$\phi 2$" and a second current electrode providing a signal labeled "Z" and connected to an input of an inverter 22. In previous known systems, different clock signals having differing clock phases derived from a common system clock have been used in the separate circuit modules or circuit portions. For example, in a synchronous data system a first circuit module which transmits data to a second circuit module would use a first clock to transmit the data, and a second circuit module which receives the data would use a second clock which is a complement of the first clock. Therefore, clock signal $\phi 2$ of FIG. 1 is the complement of clock signal $\phi 1$. An output of inverter 22 is connected to circuitry (not shown) internal to the second module 13.

Figure 2:
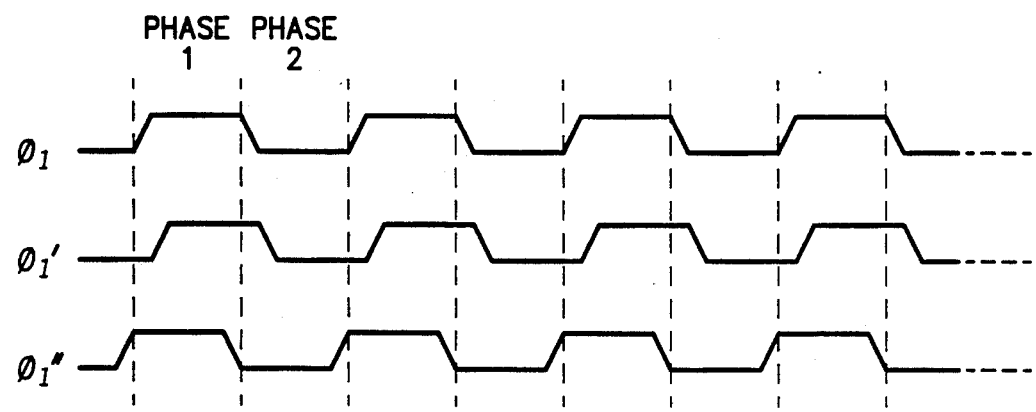
FIG. 2 illustrates in graphical form clock signals associated with the modules of FIG. 1.

Shown in FIG. 2 is a graphical illustration of the $\phi 1$ clock signal associated with the first module 11. Clock signal $\phi 1$ is initially shown having a duty cycle of predetermined frequency wherein each clock cycle is defined by having two phases, phase one and phase two.

In the ideal form, each clock phase begins with a transition in logic state of the clock. In the illustrated form, data is synchronously transmitted from module 11 to module 13. Should clock signal φ1 become skewed by being delayed in transitioning between logic states, a clock signal labeled "φ1'" results as shown in FIG. 2. And should clock signal φ1 become skewed by being advanced in transitioning between logic states, a clock signal labeled "φ1''" results. Clock signals typically have some amount of skewing associated therewith due to inherent resistance, capacitance and other factors creating delays.

Figure 3:
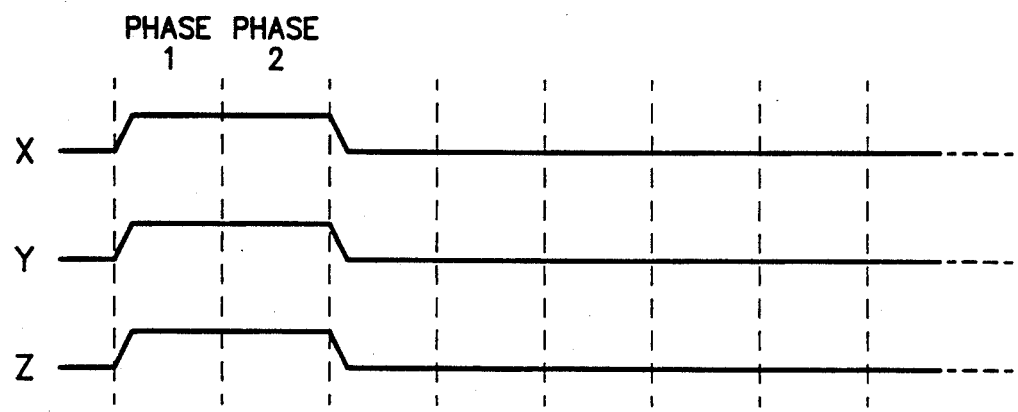
FIG. 3 illustrates in graphical form a first possible set of data signals associated with the modules of FIG. 1.

Shown in FIG. 3 is a graphical illustration of the signals associated with FIG. 1 when a race condition exists resulting from unwanted clock skew. In the illustrated form, signal X is equivalent to signal Y since both are illustrated as the same signal in FIG. 1 but at opposite ends of data bus 15. In FIG. 3, signal Z is established prematurely due to clock signal φ1' and its logical complement φ2 transitioning logic states too late. Because clock signal φ2 transitions later than intended, transistor 21 remains conductive too long. Since transistors 18 and 21 are both conductive at the same time, signal Z is established as signal Y during the same first clock phase as shown in FIG. 3. This circuit condition, in and of itself, is not critical as the timing and control of the circuitry internal to module 13 can be designed with this timing condition assumed. However, as will be shown in FIG. 4, a variation in the timing of signal Z can exist depending upon the amount of skewing which occurs to the clock signal of a transmitting module.

Figure 4:
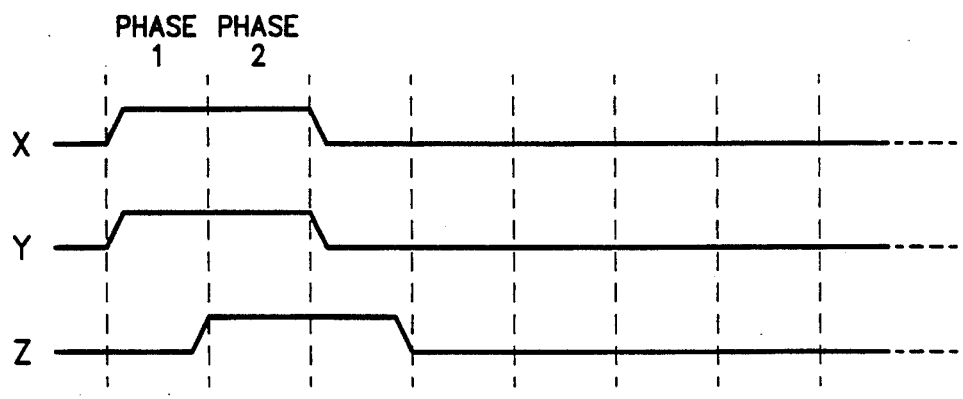
FIG. 4 illustrates in graphical form a second possible set of data signals associated with the modules of FIG. 1.

Shown in FIG. 4 is a graphical illustration of the signals associated with FIG. 1 further illustrating the race condition resulting from clock skew mentioned above. In contrast to FIG. 3, in FIG. 4 signal Z is established at a logic high level during the second clock phase illustrated which is as intended for proper timing operation of the circuitry in module 13. The waveforms of FIG. 4 result when clock signal φ1 transitions either exactly at the beginning of a clock cycle or transitions slightly before the beginning of a clock cycle as clock signal φ1'' does. Because there is variation as to when signal Z will be valid at the input of inverter 22, the operation and timing of the circuitry of module 13 cannot be reliably guaranteed.

Figure 5:
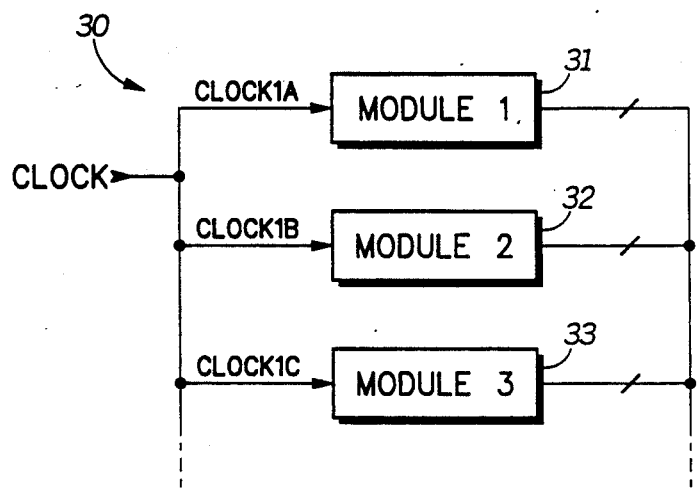
FIG. 5 illustrates in block diagram form a coupling of a plurality of circuit modules in accordance with the present invention.

Shown in FIG. 5 is a block diagram of an integrated circuit 30 having a plurality of circuit portions or modules, such as a first module 31, a second module 32 and a third module 33. Each of the modules is clocked by the same system clock. Because of inherent clock skews, each clock which is connected to each module will be slightly different from each other. Therefore, in FIG. 5 a clock signal labeled "Clock 1A" is connected to a clock input of module 31. A clock signal labeled "Clock 1B" is connected to a clock input of module 32. A clock signal labeled "Clock 1C" is connected to a clock input module 33. Each of modules 31, 32 and 33 has an input and an output terminal for synchronously transferring data between modules. In other words, data may be transmitted from any module to any other module.

Figure 6:
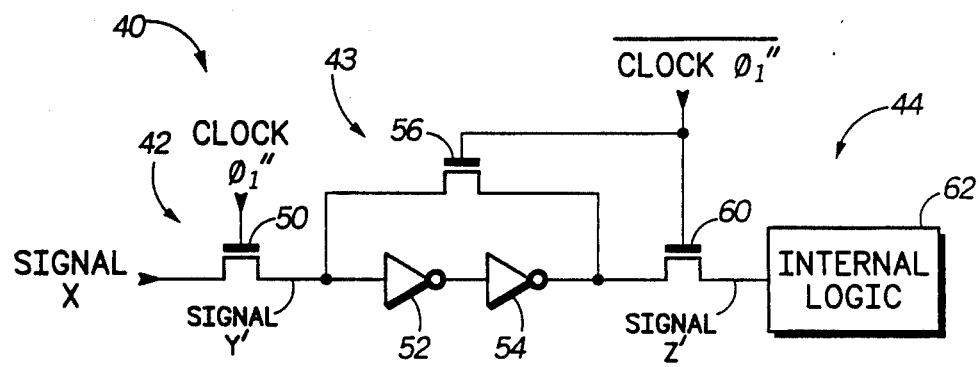
FIG. 6 illustrates in partial schematic form a clocked data input structure for each of the modules of FIG. 5.

Shown in FIG. 6 is a partial schematic illustration of a latched implementation of the present invention. FIG. 6 illustrates an input portion 40 of any of the modules 31-33 for synchronously receiving data from one of the other modules. Input portion 40 generally comprises a receive section 42, a latch section 43 and a drive section 44. It should be well understood that the present invention may be implemented without using latch section 43 in which case latch section 43 is replaced with only a dynamic node. A dynamic node is not a latch but nevertheless is capable of capturing and storing a data value for a finite amount of time required to allow the data value to be coupled to another destination in any of the modules 31-33. A dynamic node works very well for high frequency applications where transistors are switching regularly. For slower operating frequencies, a latch such as latch section 43 may be desirable. Receive section 42 has an input terminal for receiving an input signal labeled "Signal X" from any of the plurality of modules in integrated circuit 30. Signal X is sent by one of the other modules in response to a predetermined phase of clock signal φ1. A first current electrode of a transistor 50 is connected to the input terminal. Transistor 50 has a control electrode for receiving a clock signal labeled "φ1''" and has a second current electrode for providing a signal Y' connected to an input of an inverter 52 of latch section 43. An output of inverter 54 is connected to a first current electrode of a transistor 56. A control electrode of transistor 56 is connected to a complement of the clock signal φ1''. A second current electrode of transistor 56 is connected to an input of inverter 52. It should be well understood that any type of latch circuit may be used and substituted for latch section 43. Also, the transistors illustrated herein are shown by way of example only and may be implemented in any semiconductor process with other types of transistors of any conductivity type. Drive section 44 comprises a transistor 60 having a first current electrode connected to the output of inverter 54, a control electrode connected to a complement of the clock signal φ1'' and a second current electrode for providing a signal Z' connected to internal logic circuitry 62.

Figure 7:
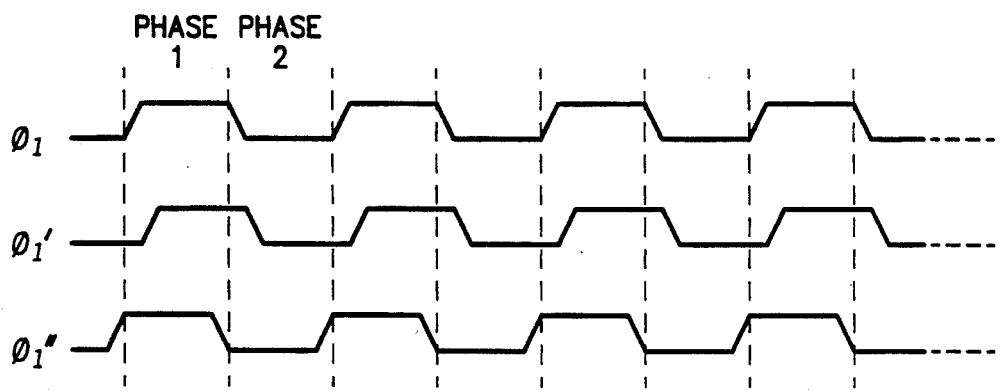
FIG. 7 illustrates in graphical form three versions of the same clock signal used to clock the circuit modules of FIG. 5.

In operation, input portion 40 functions to guarantee that signal Z' is presented to the internal logic 62 at the same predetermined clock phase in relation to signals X and Y' regardless of the amount of clock skew which exists between clock signal φ1 and the signal controlling transistor 50 (and its complement controlling transistor 60). Although FIG. 6 only illustrates an input structure which may be utilized in each of the modules herein described, it should be well understood that a transmitting portion (not shown) which is synchronized by clock signal φ1 also exists in each module in the preferred form. The transmitting portion may be implemented in many ways such as a clocked driver circuit. The advantages of the present invention are provided by using the same clock phase of a system clock to clock each of modules 31, 32, 33, etc. even though a varying amount of skewing occurs for each module's clock. Shown in FIG. 7 is a clock signal φ1 which represents the system clock in FIG. 5 which is connected to each of the modules 31-33. Although clock signal φ1 is assumed to have substantially the same frequency as the system clock, it should be well understood that clock signal φ1 may be a multiple frequency of the system clock. Clock signals φ1' and φ1'' respectively illustrate a lagging and leading clock skew of clock signal φ1 which may be symptomatic of any of the clocks labeled clock 1A, clock 1B and clock 1C in FIG. 5. Although a leading clock skew version of clock signal φ1 is shown as being connected to the gate of transistor 50, the trailing clock φ1' may also be connected to the gate of transistor 50. Regardless of the clock skew, no race condition failures resulting from race conditions in any of the modules will be created as will be discussed below.

Figure 8:
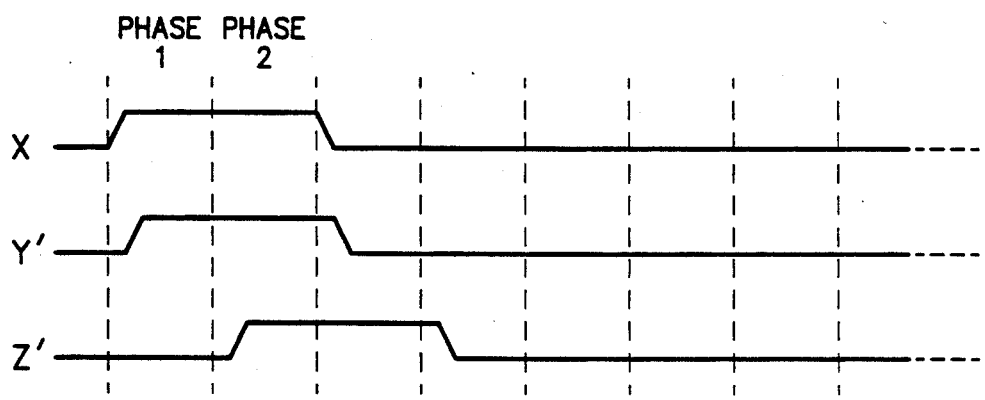
FIG. 8 illustrates in graphical form data signals resulting from a first clock skew condition associated with the modules of FIG. 5.

Shown in FIG. 8 is a graphical representation of signals X, Y' and Z' associated with input portion 40 assuming that clock signal $\phi1'$, which is connected to the gate of transistor 50 rather than clock signal $\phi1''$, has a trailing edge skew. The trailing edge results in transistor 50 becoming conductive shortly after signal X is presented to the first current electrode of transistor 50. Therefore, the leading edge of signal Y' is slightly skewed or delayed from the leading edge of signal X. The complement of clock signal $\phi1'$ keeps transistor 60 nonconductive until latch section 43 has latched the first clock phase of signal X. When clock signal $\phi1'$ makes transistor 50 nonconductive, transistor 60 becomes conductive and provides data signal Z' during the second clock phase to the internal logic 62. Since the transmitting circuit module has the same transmitting clock as the receiving circuit module, the Z' data signal will never become active or asserted during the first clock phase of FIG. 8 even when clock signal $\phi1'$ has a trailing edge skew. In contrast, in the known system of FIG. 1, the clocking function of the second module 13 operated independently of the first module 11 which allowed clock skewing associated with a transmitting module to negatively affect the operating timing of the receiving module.

Figure 9:
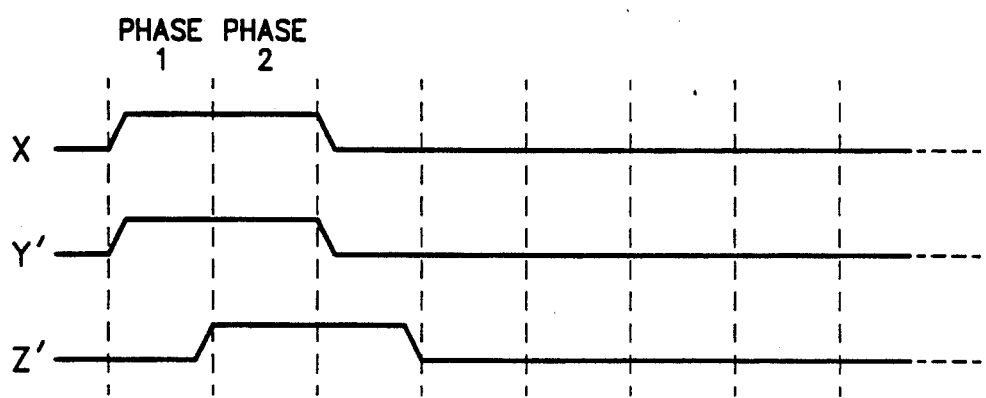
FIG. 9 illustrates in graphical form data signals resulting from a second clock skew condition associated with the modules of FIG. 5.

Shown in FIG. 9 is a graphical representation of signals X, y' and Z' associated with input portion 40 assuming that clock signal $\phi1''$, which is connected to the gate of transistor 50 as shown in FIG. 6, has a leading edge skew. The leading edge of clock signal $\phi1''$ is now slightly ahead of the leading edge of data signal X. Although transistor 50 is conductive slightly before data signal X is coupled to the first current electrode of transistor 50, data signal X is immediately connected to the input of inverter 52 as data signal Y' at the beginning of the first clock cycle. When clock signal $\phi1''$ transitions before the end of the first clock cycle, transistor 60 becomes conductive thereby capturing data signal Z' which is connected to internal logic 62. However, as shown in FIG. 9, data signal Z' is logically low during almost all of the first clock phase so that logic timing and control functions are not affected in internal logic 62. Therefore, by using the same clock signal in each of modules 31, 32 and 33, race condition errors and other operating errors in the modules are avoided. By using a local clocking signal in a receiving module of integrated circuit 30 to capture an input which has the same phase relationship to a "master" clock as the clocking signal initiating the transmission of the input, effects of skewing of the clocking signals are minimized.

By now it should be apparent that the present invention provides the use of a capturing clock at a signal's destination which has the same phase, with relation to a master clock, as the source initiation clock. As a result of the elimination of errors previously created by inherent clock skewing, application specific custom designing patterned to a unique circuit implementation is eliminated.

While there have been described hereinabove the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. In a data processing system utilizing a system clock for timing and control functions in each of a plurality of circuit portions of the system, said system clock being inherently skewed when used by the system, a method for eliminating race condition errors in the system resulting from the skewing of the system clock, comprising the steps of:

transmitting data from a first of the circuit portions to a second of the circuit portions in response to the system clock during a predetermined first phase of the system clock; and selectively receiving and storing the data in the second circuit portion in response to the system clock which transmits the data, the system clock used by the second circuit portion having a logic level transition which is skewed by either a leading or lagging logic level transition of the system clock which transmits the data with respect to the first phase of the system clock, said second circuit portion comprising a first transistor having a first current electrode for receiving the data, a control electrode for receiving the first phase of the system clock, and a second current electrode, nodal means coupled to the second current electrode of the first transistor for maintaining the data a predetermined minimum amount of time, and a second transistor having a first current electrode coupled to the nodal means, a control electrode for receiving a complement of the first phase of the system clock, and a second current electrode for providing the data to circuitry internal to the second circuit portion.

2. The method for eliminating race condition errors in the data processing system of claim 1 further comprising the step of: providing a latch circuit having an input coupled to the second current electrode of the first transistor, and an output coupled to the first current electrode of the second transistor, said latch circuit storing the data longer than the predetermined minimum amount of time.

3. The method for eliminating race condition errors in the data processing system of claim 2 wherein said step of providing a latch circuit further comprises providing a clocked latch circuit having substantially the same frequency as the system clock.

4. A data processing system having a system clock for timing and control functions in each of a plurality of circuit portions of the system, said system clock having a first phase and being inherently skewed when coupled to two or more of the circuit portions, each circuit portion comprising:

first means for selectively receiving data from a predetermined circuit portion which transmits data synchronously in response to the system clock by using the first phase of the system clock to capture the received data, said first means having a first transistor having a first current electrode for receiving the data, a control electrode for receiving the first phase of the system clock, and a second current electrode, and having a latch circuit having an input coupled to the second current electrode of the first transistor and an output for providing the data; and second means coupled to the first means, said second means comprising a second transistor having a first current electrode coupled to the output of the latch circuit, a control electrode for receiving a complement of the first phase of the system clock, and a second current electrode for providing the data to circuitry internal to the circuit portion;

each circuit portion functioning logically correctly whether the system clock which is coupled to the control electrode of the first transistor has a leading edge skew or a trailing edge skew.

5. A data processing system having a system clock for timing and control functions in each of a plurality of circuit portions of the system, said system clock having a first phase and an edge transition which is inherently skewed either in advance or delayed with respect to time when coupled to two or more of the circuit portions, each circuit portion comprising:

a first transistor having a first current electrode for receiving data from a predetermined circuit portion which transmits data in response to the system clock, a control electrode for receiving a control signal having a control signal phase identical to the first phase of the system clock, and a second current electrode;

a second transistor having a first current electrode coupled to the second current electrode of the first transistor, a control electrode for receiving a complement of the control signal, and a second current electrode for providing the data to circuitry internal to the circuit portion;

a first inverter having an input coupled to the second current electrode of the first transistor, and an output;

a second inverter having an input connected to the output of the first inverter, and an output; and a third transistor having a first current electrode connected to the output of the second inverter, a control electrode for receiving the complement of the control signal, and a second current electrode connected to the second current electrode of the first transistor;

each circuit portion functioning logically correctly regardless of direction of skew of the system clock.

* * * * *